United States Patent [19]

Rzeszewski et al.

[11] 4,038,689
[45] July 26, 1977

[54] FREQUENCY SYNTHESIZER TUNING SYSTEM WITH MANUAL FINE TUNING CONTROL

[75] Inventors: Theodore S. Rzeszewski, Lombard; Paul D. Frantzis, Chicago, both of Ill.; Sotirios Sideris, Sunnyvale, Calif.

[73] Assignee: Matsushita Electric Corporation of America, Franklin Park, Ill.

[21] Appl. No.: 695,855

[22] Filed: June 14, 1976

[51] Int. Cl.$^2$ .............................................. H04N 5/44
[52] U.S. Cl. ................................. 358/191; 325/421; 325/453; 325/464; 358/195
[58] Field of Search ............................... 358/191–195; 325/419–421, 453, 457, 459, 464, 465, 468, 470; 331/1 A, 4, 25

[56] References Cited

U.S. PATENT DOCUMENTS

| 3,949,158 | 4/1976 | Rzeszewski et al. | 358/195 |
|---|---|---|---|
| 3,980,951 | 9/1976 | Breeze et al. | 325/464 |

Primary Examiner—Robert L. Griffin
Assistant Examiner—Jin F. Ng
Attorney, Agent, or Firm—Drummond, Nelson & Ptak

[57] ABSTRACT

A television tuning system employs a frequency synthesizer system for establishing the tuning of the receiver. A first programmable frequency divider controlled by a reversible counter is connected between the output of a reference oscillator and a phase comparator to which the output of the local oscillator, after passing through another programmable frequency divider, also is applied. The phase comparator output is a tuning voltage used to control the tuning of the local oscillator. A logic circuit is coupled to sense predetermined relationships of signals from a picture carrier detector, a sound carrier detector, an AFT signal, and the presence of vertical synchronization signal components for changing the count in the reversible binary counter to adjust the first programmable frequency divider to compensate for channel frequency offsets which may occur in excess of the pull-in range of the AFT circuit. To enable operation of the receiver in a fringe area, where it may be desirable to intentionally mistune a channel slightly, manual fine tuning control logic circuitry is employed to disable the frequency offset logic circuit and to permit changing the count of the reversible counter by the viewer to manually fine tune the receiver as desired.

12 Claims, 2 Drawing Figures

FREQUENCY SYNTHESIZER TUNING SYSTEM WITH MANUAL FINE TUNING CONTROL

RELATED APPLICATION

This application is directed to an improvement in the tuning system disclosed in copending application Ser. No. 635,716, filed Nov. 26, 1975, and assigned to the same assignee as the present application. The subject matter of copending application Ser. No. 635,716 is incorporated into the disclosure of this application by reference.

BACKGROUND OF THE INVENTION

As described in the above-mentioned copending application, one adjustment which still generally must be made in most television receivers is a fine tuning adjustment. The system disclosed in the above copending application is directed to a frequency synthesizer tuning system having a wide pull-in range and operating to automatically correct for frequency offsets without affecting the operation of the conventional frequency synthesizer in the tuning system used. Such a system represents a substantial improvement over systems of the prior art which either required a manual fine tuning adjustment or which merely used a conventional frequency synthesizer system without a frequency offset correction provision. The system disclosed in this copending application eliminated the need for the manual fine tuning adjustment for receivers used in strong signal areas or responding to strong transmitted signals with no interference. In addition, the automatic offset correction prevented the receiver from being erroneously mistuned when there was an offset in the transmitted carrier frequency.

While such a system appears to completely solve the problem of fine tuning adjustments in a television receiver, there are situations which arise in which the frequency synthesizer system with automatic offset frequency correction does not necessarily give the most desirable picture. This is particularly true when the television receiver is in a fringe area for the station to which it is tuned. For fringe area reception, it often is desirable to intentionally mistune the television receiver to minimize noise or interference. If this were to be done, however, in a system having the automatic offset frequency correction disclosed in the above copending application, the automatic offset correction operation of the system would tune the receiver back to the nominal "correct" tuning point. But such a tuning point for weak signals may not be what the viewer wants.

Therefore, it is desirable to include a manual fine tuning adjustment capability in a frequency synthesizer tuner having a provision for automatic correction of frequency offsets. This then would result in maximum flexibility of the tuning system under all conditions of operation of the receiver. In addition, it is desirable to provide a manual fine tuning adjustment of a frequency synthesizer television receiver which is also capable of having an automatic signal seek mode, while preventing undesirable interfering interaction of the manual fine tuning and the signal seek circuitry of the receiver.

SUMMARY OF THE INVENTION

Accordingly, it is an object of this invention to provide an improved tuning system for a television receiver.

It is an additional object of this invention to provide an improved frequency synthesizer tuning system for a television receiver.

It is another object of this invention to provide an improved frequency synthesizer tuning system for a television receiver which includes a provision for adjusting the synthesizer loop for frequency offsets of the received signal, and, in addition, has a provision for permitting manual fine tuning adjustments of the frequency synthesizer loop.

It is a further object of this invention to provide a frequency synthesizer tuning system for a television receiver with a manual fine tuning adjustment.

In accordance with a preferred embodiment of this invention, a frequency synthesizer tuning system for the tuner of a television receiver includes a voltage controlled local oscillator in the tuner and a stable reference oscillator. A first programmable frequency divider is connected between the output of the reference oscillator and one input to a phase comparator. A second programmable frequency divider is connected between the output of the local oscillator and the other input to the phase comparator. The output of the phase comparator then omprises a control signal which is supplied to the local oscillator to control the frequency of its operation. A channel selection means is coupled with the second programmable frequency divider to establish the programmable division ratio or programmable fraction of that divider.

A manual fine tuning means is connected with the first programmable frequency divider to control the division ratio of the first frequency divider to establish a programmable fraction of division as desired by the operator of the manual fine tuning control means. Each time a new channel is selected by the operator of the receiver, the first programmable frequency divider is reset to a preestablished nominal division ratio.

DETAILED DESCRIPTION

Figure 1:
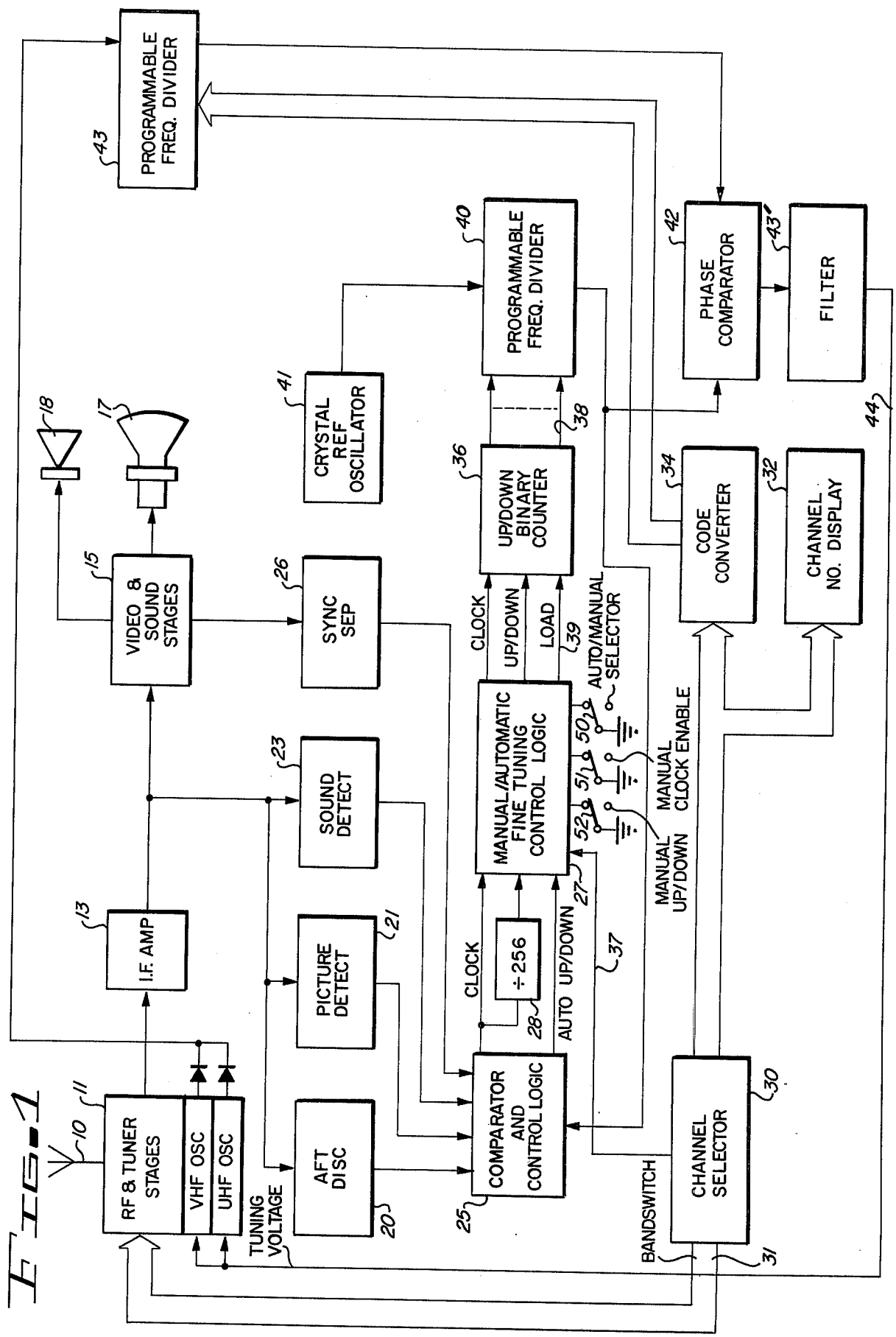
FIG. 1 is a block diagram of a television receiver employing a preferred embodiment of the invention.

Referring now to the drawings, the same reference numbers are used throughout the several figures to designate the same or similar components. In addition, in FIG. 1, the reference numbers of components which also are disclosed in copending patent application Ser. No. 635,716, referred to above, are the same as used in that application.

FIG. 1 is a block diagram of a television receiver, which may be a black-and-white or color television receiver, to which has been added a frequency synthesizer tuning system of the type disclosed in the aforementioned copending application. Most of the circuitry of FIG. 1 is the same as the corresponding figure of such copending application, but to that circuitry is added circuitry to permit manual fine tuning of the receiver as desired by the viewer.

A major portion of the circuitry of the television receiver shown in FIG. 1 is conventional, and for that reason it has not been shown in detail. Transmitted composite television signals, either received over the air or distributed by means of a master antenna T.V. distribution system are received by an antenna 10 or on antenna input terminals to the receiver. As is well known, these composite signals include picture and sound carrier components and synchronizing signal components, with the composite signal being applied to an RF and tuner stage 11 of the receiver. The stage 11 includes the RF amplifiers and tuner sections of the receiver, including a VHF oscillator section and a UHF oscillator section, specifically indicated as such in the stage 11 of FIG. 1. Preferably, the UHF and VHF local oscillators are voltage-controlled oscillators, the frequency of which is varied in response to a tuning voltage applied to them to effect the desired tuning of the receiver.

The output of the RF and tuner stages 11 is applied to an IF amplifier stage 13 which supplies the conventional picture (video) and sound IF signals to video and sound processing stages 15 of the receiver. The stages 15 may be of any conventional type used to separate, amplify, and otherwise process the signals for application to a cathode ray tube 17 and a loudspeaker 18, which reproduce the picture and sound components, respectively, of the received signal.

The output of the IF amplifier 13 also is supplied to a conventional AFT or automatic fine tuning discriminator circuit 20 for developing an automatic fine tuning control voltage that is applied through the control circuitry. This voltage is used to maintain the tuning of tuner stages 11 even if the signal source experiences frequency drifts, once proper tuning of the receiver initially has been effected. In addition, the output of the IF amplifier stage 13 is supplied to a narrow-band picture carrier detection circuit 21 and a narrow-band sound carrier detection circuit 23 which produce output signals whenever a carrier is tuned to the narrow-band of frequencies each of these circuits is designed to detect. For a properly tuned television station, the picture carrier detector circuit 21 and the sound carrier detector circuit 23 both will simultaneously produce output signals. If neither of these circuits produces an output signal for a selected channel, this is indicative that no transmitted signal is present for that channel. In addition, if only one of the circuits 21 or 23 produces an output signal, this is indicative of a grossly mistuned condition of the receiver.

The outputs of the discriminator 20 and the detectors 21 and 23 are supplied to a comparator and control logic circuit 25, which also is provided with synchronizing signals, such as the vertical synchronizing signals obtained from a conventional synchronizing signal separator circuit 26 coupled with the video and sound stages 15 of the receiver.

When the viewer desires to select a new channel, he enters the desired channel number into a channel selector and keyboard 30. There are a number of different keyboards which may be employed to accomplish this function, and the particular design is not important to this invention. The channel selector 30 also includes interface, processing, memory, decoding circuits, and switching circuitry for providing a band-switch function over band switching control leads 31 to the RF and tuner stages 11. Once again, this is straightforward approach to relate the appropriate band switching information to the tuner according to the channel which has been selected. The channel selector keyboard 30 then provides output signals which operate a channel number display 32 to provide an appropriate display of the selected channel number to the viewer.

The signals which are utilized to operate the channel number display 32 also are applied to a code converter circuit 34 which decodes the selected channel number into a parallel-encoded signal. This may be done in any conventional manner and may be in the form of BCD code or another suitable code. This encoded signal is applied to corresponding inputs of a programmable frequency divider 43 to cause the division number to relate the divided-down frequency of the tuner oscillators to the frequency of a reference oscillator 41 for properly tuning the receiver to the selected channel. Conventional frequency synethesizer techniques are employed, except the code converter 34 is necessary because of non-uniform channel spacing of the television signals. It is most convenient to cause the programmable divider 43 to divide by numbers corresponding to the oscillator frequency of the selected channel. For example, 101, 107, 113 . . . up to 931. However, this could be a multiple of the oscillator frequency if desired.

A timing pulse generated by the keyboard interface circuit is applied over a lead 37 each time a new channel number is selected by the keyboard 30. The pulse on the lead 37 is applied to an input of a manual/automatic tuning control logic circuit 27 which in turn supplies an output pulse on a lead 39 to load or enter a fixed binary number into a reversible binary counter 36. The manner in which this is done is explained more fully in conjunction with FIG. 2. This number is selected to be at or near the midpoint of the count capacity of the counter 36.

The outputs of each of the stages of the binary counter 36 then are applied over parallel output leads 38 to corresponding inputs of a second programmable frequency divider 40. A fixed frequency stable crystal reference oscillator 41 is coupled to the input of the frequency divider 40; so that the output signal of the divider 40 is a stable reference frequency used to maintain tuning of the receiver to the selected channel. This divided-down stable reference signal is supplied to one of two inputs of a phase comparator circuit 42. The other input to the phase comparator circuit 42 is supplied from the selected one of the VHF or UHF oscillators in the tuner stages 11 through the programmable divider circuit 43. The phase comparator 42 operates in a conventional manner to supply a direct current (DC) tuning control signal through a filter circuit 43' (that filters out high frequency components) and over a lead 44 to the oscillators in the tuner stages 11 to change and maintain their operating frequency.

The operation of the system which has been described thus far is very similar to that of a relatively conventional frequency synthesizer system. If, however, there is a frequency offset in the received signal causing the carrier of the received signal to be displaced from the frequency which it should have to some other frequency, it is possible that the system would give the appearance of mistuning the received station. To eliminate this disadvantage and still retain the advantages of fully automatic "hands off" frequency synthesizer tuning, the comparator and control logic circuit 25 is employed in conjunction with the reversible binary counter 36 and programmable frequency divider 40 to automatically maintain proper tuning.

If the manual/automatic fine tuning control logic circuit 27 is set to its automatic mode of operation by the switch 50 connected to the uppermost one of its contacts as shown in FIG. 1, the frequency synthesizer system tunes the local oscillator in the tuner stages 11 to the correct frequency for that particular channel, as described previously. Then the comparator and control logic circuit 25 responds to the output of the AFT discriminator circuit 20 to see if the output voltage of the AFT circuit is within a specified window. If that condition is present, the control logic circuit 25 determines that there is no frequency offset and the system operates as a conventional frequency synthesizer tuning system so long as the picture detector 21, sound detector 23, and vertical synchronizing signals are present. If, however, the AFT voltage at the output of the AFT discriminator 20 is outside this window, or if the proper outputs are not present from the detectors 21 and 23, or the sync separator 26, the comparator and control logic circuit 25 operates to change the count in the binary counter 36. This change is in the proper direction established by the circuit 25 in response to its inputs to effect a corresponding change in the division ratio or division number of the programmable frequency divider 40. This in turn causes the reference oscillator frequency applied to the phase comparator 42 to be automatically changed to correct for the frequency offset in the received carrier signal.

If the auto/manual selector switch 50 is connected to its lower terminal (manual mode), the circuit 27 prevents the comparator and control logic circuit 25 from affecting the operation of the up/down binary counter 36. The operation of the counter 36, however, then may be controlled by the appropriate operation of the switches 51 and 52, which control, respectively, the operation of a manual clock to apply clock pulses to the counter 36 and the direction of operation of the counter 36 in response to such clock pulses. This permits an overriding manual control of the division ratio of the programmable frequency divider 40, so that fine tuning adjustments may be made by the viewer of the receiver if for any reason he is dissatisfied with the tuning effected by the automatic tuning described above.

Whenter the system is operated in its manual mode or in its automatic mode, it always maintains the crystal stability of the oscillator 41 in its operation to accurately maintain the tuning which has been established. The manual fine tuning override which is effected by the control logic circuit 27 is particularly valuable for the reception of weak or fringe area television signals. For such signals, it often is desirable to intentionally mistune the receiver to minimize noise or interference. In the case of color television signals, such mistuning generally is such to eliminate the color portion of the received signal and cause the reproduced picture to be a monochrome or black-and-white picture with some loss of high frequency luminance detail. This provides a noticeable improvement in signal-to-noise by increasing the level of the carrier and lower frequency luminance information in the IF without changing the noise bandwidth.

If the manual fine tuning capability is not necessary or is not desired, the switch 50 may be operated in its upper position (the automatic position), thereby disabling the manual mode of operation in the logic circuit 27 and permitting the automatic offset tuning capabilities provided by the comparator and control logic circuit 25 to once again control the operation of the tuning synthesizer loop. Thus, the manual fine tuning capabilities of the system disclosed in FIG. 1 are fully compatible with the automatic frequency offset adjustment operation provided by the comparator and control logic circuit 25.

Figure 2:
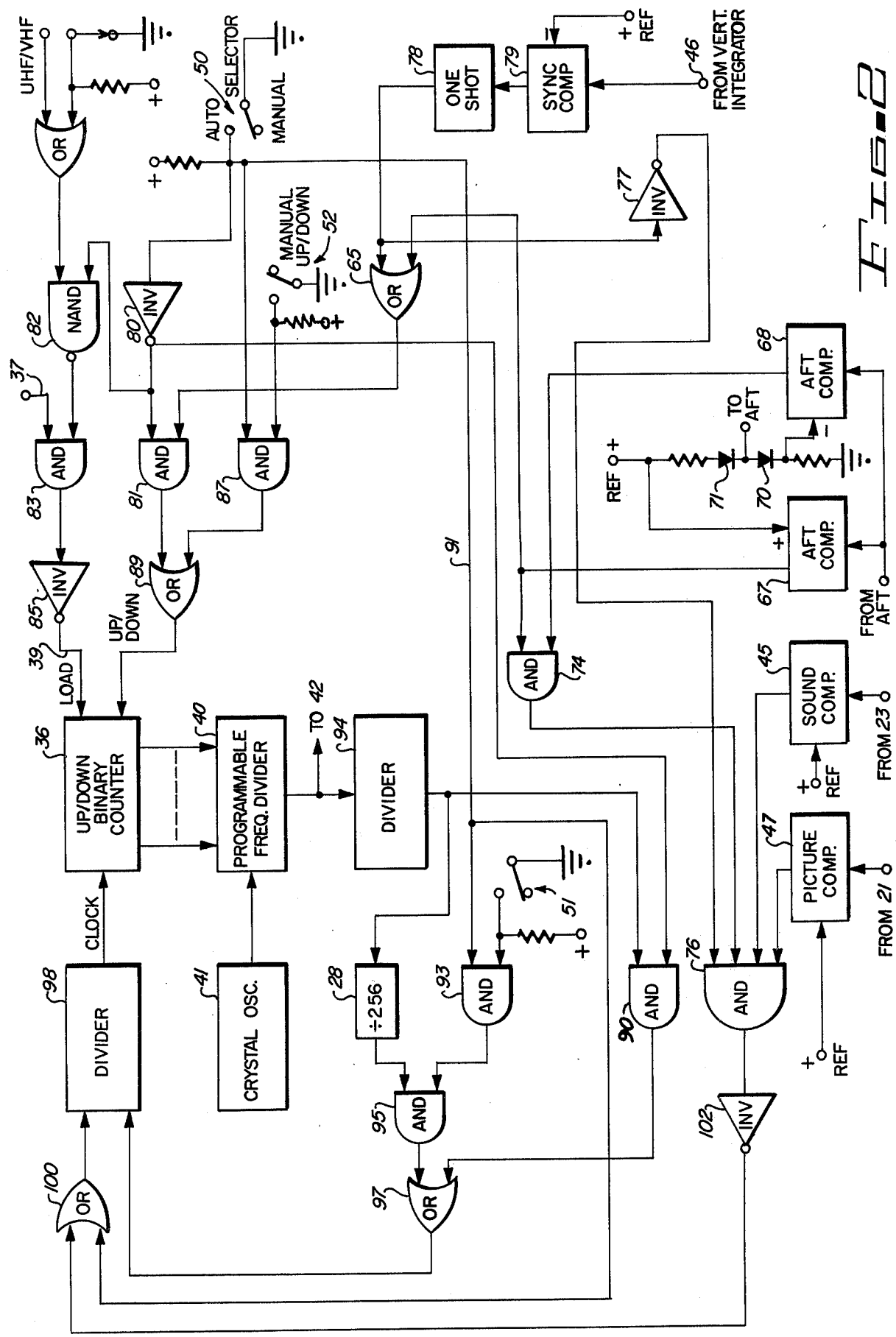
FIG. 2 is a more detailed block diagram of a portion of the circuit shown in FIG. 1.

The comparator and control logic circuit 25 and the manual/automatic fine tuning control logic circuit 27 are shown in greater detail in FIG. 2, to which reference now should be made. It should be noted that although two separate circuits 25 and 27 are shown in FIG. 1 to simplify the description of operation of the system, the logic of these two circuits is closely interrelated, and in some portions is shared, as will become apparent in conjunction with the description of the operation of the circuit shown in FIG. 2. The reversible binary counter 36, programmable frequency divider 40, and crystal oscillator 41 also are shown in FIG. 2 to indicate the interrelation of these components of the circuit with the logic circuits 25 and 27, which comprise the remainder of the circuitry shown.

In considering the operation of the circuit shown in FIG. 2, assume that the auto/manual selector switch 50 is moved to its automatic (upper) position. In this position, ground is applied through the movable contact of the switch to the upper or "auto" terminal, as shown in FIG. 2. This, then, is inverted by an inverter 80 to a high or positive signal which enables an AND gate 81 and further enables a NAND gate 82 which, however, for the purposes of the present discussion, has a low potential applied to its other input so that the output of the NAND gate 82 remains high. This, in turn, enables an AND gate 83 to permit the passage of the positive reset or load pulses appearing on the lead 37 through the AND gate 83. These pulses, in turn, are inverted by an inverter 85 and are applied over the lead 39 to the binary counter 36 to reset the counter to its center count, as described previously, each time a new channel is selected in the channel selector keyboard 30 (FIG. 1). The inverter 85 is included to cause a negative reset pulse to be applied over the lead 39 because of the characteristics of the counter 36. If the characteristics of the counter 36 are such that it is reset by positive pulses, the inverter 85 could be eliminated. In such a case, the lead 39 would be connected directly to the output of the AND gate 83.

The ground potential applied by the switch 50 to the upper terminal (the auto terminal) of the auto/manual selector switch also is applied to an AND gate 87 to disable the AND gate 87. The other input to the AND gate 87 is obtained from the switch 52 which is the manual up/down control. The outputs of the AND gates 81 and 87 both are applied to an OR gate 89 which supplies the up/down control signal to the binary counter 36. When the AND gate 81 is enabled and the AND gate 87 is disabled, the automatic up/down signal applied to the lower input of the AND gate 81 then controls the output of the OR gate 89 to determine the direction of counting of the counter 36.

The output of the inverter 80 also is applied to the lower input of an AND gate 90 to enable the AND gate 90 whenever the selector switch 50 is connected to its "auto" position. At the same time, the ground potential applied to the input of the inverter 80 by the switch 50 when it is in its "auto" position also is applied to the upper input of an AND gate 93 to disable the AND gate 93. The other input to the AND gate 93 is obtained from the switch 51 which normally is closed to apply ground potential to the lower terminal of the gate 93. The switch 51, as described previously, is the manual clock enable switch. The operation of this switch 51, however, has no effect on the circuit operation so long as the auto/manual selector switch 50 is in its "auto" mode disabling the AND gate 93.

The clock pulses for changing the count in the binary counter 36 in either direction, as determined by the up/down control signal applied to it, are derived from the crystal oscillator 41 and the programmable frequency divider 40. The output signals from the programmable frequency divider 40 are applied to the phase comparator 42, as described previously in conjunction with FIG. 1. These same pulses are also supplied through an additional divider 94, the output of which is connected directly to the upper terminal of the AND gate 90. The output of the divider 94 also is supplied through the divide-by-256 circuit 28 which supplies signals to one input of an AND gate 95. The other input to the AND gate 95 is obtained from the output of the AND gate 93. The outputs of the AND gates 90 and 95 both are supplied to an OR gate 97 which, in turn, supplies clock pulses to a divider circuit 98, the output of which finally constitutes the clock pulses used to drive the binary counter 36.

The divider 98 is a four-bit binary circuit in the configuration of FIG. 2, which is enabled or disabled in accordance with the output of an OR gate 100 connected to a control input of the divider circuit 98. This can be accomplished by a simple inhibit gate controlled by the output of the OR gate 100 or may be accomplished by stopping the clock input that comes from OR gate 97. The particular manner in which the divider 98 is enabled or disabled to pass clock pulses through to its output is not important to an understanding of the operation of this system.

With the system in its automatic mode, the AND gate 90 is enabled and the AND gate 95 is disabled, so that any clock pulses which are applied to the divider 98 are supplied through the AND gate 90 from the divider 94. The operational position of the manual clock switch 51 has no effect on the operation of the circuit when it is in this mode.

Ideally, the center count which is set into the counter 36 upon the selection of a new channel should result in accurate tuning of the receiver to the desired channel, as determined by the division ratio set into the programmable frequency divider 43 (FIG. 1). The tuning accuracy of the system is a function of the stability of the crystal controlled reference oscillator 41. As also described previously, however, if a frequency offset is present in the signal of the selected channel, the comparator and control logic circuit 25 causes the count in the binary counter 36 to be increased or decreased by an amount sufficient to change the division ratio of the programmable frequency divider 40 to effect the desired change in the tuning voltage from the output of the phase comparator 42 necessary to properly tune the local oscillators in the RF and tuner stages 11 of the receiver.

Once the new channel is selected, the presence of a channel signal transmission is detected by the picture detector 21, the sound detector 23 and the sync separator circuit 26 (FIG. 1). If a carrier is detected by the picture carrier detector circuit 21, the output of the picture carrier detector 21 applied to a comparator circuit 47 causes the output of the comparator circuit 47 to go high (positive). Similarly, the detection of a sound carrier by the sound carrier detector circuit 23 causes the output of the sound comparator circuit 45 to go high. Additional information for determining whether or not the receiver is properly tuned to a selected channel is supplied from the AFT discriminator 20 (FIG. 1) to a pair of AFT comparator circuits 67 and 68. The outputs of these two circuits are connected to the inputs of an AND gate 74, the output of which in turn comprises a third input to the AND gate 76.

An additional piece of information which is used to determine whether the receiver is properly tuned to a received station is obtained from the synchronizing separator circuit 26 in the form of vertical sync pulses applied to a terminal 46. When these vertical synchronizing pulses, representative of a properly tuned channel are present, the output of the comparator circuit 79 is a constant high potential. This permits a one-shot multivibrator connected and operated as a missing pulse detector 78 to time out; so that its output is a normally low output, inverted by an inverter 77 to a high output. The output of the inverter 77 then constitutes the fourth input to the AND gate 76.

As a consequence, for a properly tuned channel with the AFT potential remaining within the window established by a pair of diodes 70 and 71 for the AFT comparators 67 and 68, the inputs to the AND gate 76 all are high. This results in a high output from the AND gate 76 which is inverted by an inverter 102 to form a second low input to the OR gate 100. Under these conditions of operation, the low output from the OR gate 100 disables the divider circuit 98, and no clock pulses are supplied through the divider 98 to the reversible counter 36. Thus, no change in the count of the binary counter can take place.

If now, for some reason, the AFT voltage supplied to the inputs of the comparator circuits 67 and 68 should rise above the voltage between the diodes 70 and 71 to a potential greater than one diode drop, the output of the comparator 67 goes low, while the output of the comparator 68 remains high. This causes the output of the AND gate 74 to go low, which in turn causes the output of the AND gate 76 also to go low. As a result, the output of the inverter 102 is high, and this high output is passed by the OR gate 100 to enable the divider circuit 98. As a consequence, clock pulses applied to the divider circuit 98 from the output of the OR gate 97 are passed through it to change the count in the binary counter 36 in response to the application of such clock pulses. The direction in which the count of the binary counter 36 is changed is controlled by the output of an OR gate 65 which has inputs supplied to it from the comparator 67 and the one-shot multivibrator 78.

For the condition under discussion, the incoming signal is tuned low, that is, toward the next lower adjacent channel. For this condition, the sync pulse output from the vertical integrator on the terminal 46 also is normal, so that the output of the one-shot multivibrator 78 remains low. Thus, both inputs to the OR gate 65 are low, so that the potential on its output also is low. This results in a low output from the AND gate 87 and the OR gate 89, causing the count in the binary counter 36 to advance for the application of each clock pulse applied through the programmable divider 98. This, in turn, causes corresponding changes in the division ratio or division number of the programmable frequency divider 40, thereby resulting in a change in the tuning voltage from the phase comparator 44.

When proper tuning once again is achieved, the AFT signal will be back again within the window established by the diodes 70 and 71; and the outputs of both AFT comparators 67 and 68 go high. Thus, the outputs of the AND gates 74 and 76 also go high. This, once again, inhibits the passage of pulses by the divider circuit 98, thereby terminating the application of further clock pulses to the reversible counter 36. Once this occurs, tuning of the oscillators in the tuner stages 11 is maintained by the normal output of the phase comparator 42 via the lead 44

If the incoming signal is tuned high, the AFT voltage applied to the inputs of the comparators 67 and 68 drops below the potential at the junction of the diodes 70 and 71. This is tuning toward the next adjacent higher channel and results in a relatively negative output from the AFT circuit 20 because the picture carrier is tuned toward the adjacent channel sound trap. Once the voltage of this signal decreases to more than one diode drop below the voltage at the junction of the diodes 70 and 71, the output of the AFT comparator 68 goes low, while the output of the comparator 67 remains high. As a consequence, the outputs of the AND gates 74 and 76 once again go low; and clock pulses are passed through the divider circuit 98. The up/down control potential on the output of the OR gate 65, however, now is high since the OR gate 65 has a high input applied to it from the comparator 67. Thus, the counter 36 is caused to count in the opposite or reverse direction. This effects the desired reference oscillator frequency correction in the same manner as described previously, but in the opposite direction.

The operation of this portion of the circuit for automatically effecting up or down counts by the binary counter 36 to adjust for frequency offsets in the received signal is described in detail in the above-mentioned copending application. In that application, there also is a description of additional circuitry for effecting correction of mis-tuning for positions when the AFT signal from the AFT discriminator 20 crosses the zero reference voltage far outside of the window of correct tuning. Reference should be made to that application for a description of the circuit operation to recognize this condition and effect the proper correction in response to it.

Assume now that the system is placed in its manual mode of operation. In this mode, the manual selector switch 50 is moved to contact the lower terminal. This causes a positive potential to be applied to the input of the inverter 80. The inversion of this potential then serves to disable the AND gates 81 and 90 and forces the output of the NAND gate 82 to remain high, irrespective of the condition of the other inputs supplied to it. Thus, the AND gate 83 remains enabled; so that when a new channel is selected, the pulse appearing on the lead 37 is applied through the gate 83 and the inverter 85 to the load input terminal 39. This causes the binary counter to be set to a center count, as described previously. At the same time, the AND gates 87 and 93 are enabled and a positive potential is applied through the OR gate 100 from the positive potential applied to the input of the inverter 80 to force the divider circuit 98 to be enabled so long as the system is in its manual mode of operation.

The direction of counting for the binary counter 36 then is established by the output of the AND gate 87 under the control of the manual up/down switch 52. When the switch is open, as shown, a positive potential is applied from the output of the AND gate 87 through the OR gate 89 to control the counter 36. When the manual up/down switch 52 is closed to apply ground potential to the AND gate 87, the gate output drops to a low potential, causing a low potential to be applied to the counter 36 from the output of the OR gate 89. In all other respects, the operation of the direction of count in the counter 36 is the same as described previously for the operation of the system in its automatic mode.

Even though the selector switch 50 is placed in its manual mode, no counting pulses are applied through the divider circuit 98 from the OR gate 97 until the manual clock enable switch 51 is switched from its normally closed position, applying ground potential to the lower input of the AND gate 93, to its lower activated position where a positive potential is applied to the AND gate 93. Since the AND gate 93 is enabled any time the switch 51 is depressed to open its circuit connection to the input of the AND gate 93, the AND gate 95 then is enabled to pass the clock pulses from the divider circuit 28 through the OR gate 97 to the divider circuit 98. These pulses then operate as the clock pulses to drive the up/down counter 36 in the direction selected by the potential on the output of the OR gate 89. A lower clock rate is used for this manual mode to give the viewer sufficient reaction time to change the tuning. When he obtains the tuning condition he desires, he releases the button 51 to disable the AND gate 93. At this time, no further counting of the counter 36 takes place, even though the OR gate 100 continues to apply a positive enabling potential to the divider 98.

Ideally, the up/down switch 52 and the manual clock enable switch 51 are ganged together in some fashion. Preferably, a pair of up/down switches 52 may be employed to perform the function of the single switch 52 shown in the drawing. Depression of either of these switches then would automatically enable or disable the AND gate 87, as the case may be, and would result in an opening of the switch 51 to enable the AND gate 93, so long as such pushbutton switches remained depressed by the operator. Upon release, the switch 51 would be closed to its upper position as shown in FIG. 2, disabling the AND gate 93.

It should be noted that the operation of the circuitry controlling the AND gate 76 is of no consequence while the circuit is in its manual mode of operation. This is because the OR gate 100 has a continuous positive potential applied to its lower input in the manual mode and the condition of its upper input is irrelevant.

A manual fine tuning adjustment changes the nominal frequency division ratio of the programmable counter that is connected between the reference oscillator and the phase comparator. This will produce a change from the nominal local oscillator frequency for all subsequent channels unless a reset means is provided. This type of offset is undesirable because no two stations would have the same offset. This is the reason that the reset pulses on the lead 37 are applied through the AND gate 83 to reset the counter 36 to its center count each time a new channel is selected. This occurs each time a channel is selected when the system remains in its manual mode of operation. The reason for this is that a manual fine tuning adjustment for one channel ordinarily is not proper for any other channel in the receiver. Thus, it is necessary either to operate the receiver in its automatic mode of operation to automatically effect proper channel locking or to retune manually for each channel where the manual tuning override of the automatic system is desired. The manual fine tuning control described above is fully compatible with the automatic offset adjustment for a frequency synthesizer tuner of the type disclosed in the above-mentioned copending application. This system also is fully compatible with a frequency synthesizer system having a signal seek capability.

When the manual fine tuning adjustment feature is added to a receiver already including circuitry for effecting automatic frequency offset correction, the additional components required for the manual fine tuning adjustment are relatively few in number and do not add substantially to the cost of the television receiver. While frequency synthesizer tuners having an automatic frequency offset adjustment ordinarily do not require any manual fine tuning adjustment whatsoever, it may be desirable to include a manual fine tuning adjustment capability which is fully compatible with such a frequency synthesizer tuning system. The manual fine tuning system described above meets those requirements at a minimum cost.

We claim:

1. A frequency synthesizer tuning system for a tuner of a television receiver capable of receiving a composite television signal, said system including in combination:
    reference oscillator means providing a reference signal at a predetermined frequency;
    local oscillator means in the tuner providing a variable output frequency in response to the application of a control signal thereto;
    a first programmable frequency divider having an input coupled to the output of said reference oscillator means for producing an output signal having a frequency which is a programmable fraction of the frequency of the signal applied to the input thereto from said reference oscillator means;
    a second programmable frequency divider having an input coupled to the output of said local oscillator means and producing an output signal having a frequency which is a programmable fraction of the frequency of the signal applied to the input thereto from said local oscillator means;
    channel selection means coupled to said second programmable frequency divider for controlling said second programmable frequency divider to establish the programmable fraction thereof;
    means coupled to the outputs of said first and second frequency dividers for developing a control signal and applying such control signal to said local oscillator means for controlling the frequency of operation thereof; and
    manual fine tuning control means coupled to said first programmable frequency divider for controlling said first frequency divider to establish the programmable fraction of division thereof as desired by an operator of said manual fine tuning control means.

2. The combination according to claim 1 further including means coupled to said channel selection means for resetting said first programmable frequency divider to a predetermined programmable fraction division ratio in response to the selection of a channel by said channel selection means differing from the previously selected channel.

3. A frequency synthesizer tuning system for a tuner of a television receiver capable of receiving a composite television signal and including automatic fine tuning (AFT) circuit means producing an AFT signal, said system including in combination:
    reference oscillator means providing a reference signal at a predetermined frequency;
    local oscillator means in the tuner providing a variable output frequency in response to the application of a control signal thereto;
    a programmable frequency divider having an input coupled to the output of said reference oscillator means for producing an output signal having a frequency which is a programmable fraction of the frequency of the signal applied to the input thereto from said reference oscillator means;
    means coupled to the output of said programmable frequency divider and said local oscillator means for developing a control signal and applying such control signal to said local oscillator means for controlling the frequency of operation thereof;
    first control means coupled to the output of the AFT circuit means and further coupled to said programmable frequency divider for controlling said frequency divider to change said programmable fraction in response to predetermined signal conditions of the AFT signal; and
    manual fine tuning control means coupled to said first control means and to said programmable frequency divider for disabling said first control means and for controlling said frequency divider to change said programmable fraction in response to operation thereof.

4. The combination according to claim 3 further including clock pulse supply means and a reversible digital counter means; wherein said first control means includes logic circuit means coupled to the AFT circuit means for causing the application of clock pulses from said clock pulse supply means to said digital counter means and for causing said counter means to count in one direction in response to said clock pulses when the AFT signal is greater than a predetermined range of voltages and for causing said counter means to count in the opposite direction when the AFT signal is less than a predetermined range of voltages, and means for coupling said digital counter means to said programmable frequency divider to change said programmable fraction in accordance with the count in said counter means; and wherein said manual fine tuning control means includes means for selectively controlling the direction of counting of said digital counter means.

5. The combination according to claim 4 further including channel selection means coupled to said reversible digital counter means for causing a predetermined count to be entered into said counter means each time a new channel is selected by said channel selection means.

6. The combination according to claim 4 further including means for providing clock pulses at a first frequency and a second higher frequency to said reversible digital counter means; wherein said first control means supplies said clock pulses at said first frequency and said manual fine tuning control means selectively blocks the application of clock pulses at said first frequency and causes said clock pulses at said second predetermined frequency to be applied to said counter means.

7. The combination according to claim 4 further including additional means coupled to said counter means and coupled to said logic circuit means for preventing a change in the count of said counter means where the AFT signal is within said predetermined range of voltages.

8. A frequency synthesizer tuning system for a tuner of a television receiver capable of receiving a composite television signal having at least carrier signal components and synchronizing signal components, said system including in combination:
    reference oscillator means providing a reference signal at a predetermined frequency;

local oscillator means in a tuner providing a variable output frequency in response to the application of a control signal thereto;

programmable frequency divider means having an input coupled to the output of said reference oscillator means for producing an output signal having a frequency which is a programmable fraction of the frequency of the signal applied to the input thereto from such reference oscillator means;

means coupled to the output of said programmable frequency divider means and said local oscillator means for developing a control signal and applying such control signal to said local oscillator means for controlling the frequency of operation thereof;

carrier sensing means coupled to receive at least the carrier signal components of the composite signal and providing an output voltage indicative of the tuning of said receiver to a carrier component of said composite signal;

synchronizing signal components sensing means coupled to receive at least said synchronizing signal components of the composite signal for providing a first predetermined output with synchronizing signal components sensed thereby;

first control means coupled to the outputs of said carrier sensing means and said synchronizing signal components sensing means and further coupled to said programmable frequency divider means for changing said programmable fraction in response to predetermined signals at the outputs of said carrier sensing means and said synchronizing signal components sensing means; and manual fine tuning control means coupled to said first control means and to said programmable frequency divider and operable to disable said first control means and to change said programmable fraction of said programmable frequency divider to a predetermined manner.

9. The combination according to claim 8 further including a reversible digital counter means coupled with said programmable frequency divider for establishing said programmable fraction, and wherein said first control means includes logic circuit means coupled to said carrier sensing means and said synchronizing signal components sensing means for causing said counter means to count in one direction when a first relationship exists between the output signals of said carrier signal sensing means and said synchronizing signal components sensing means and for causing said counter means to count in the opposite direction when a second relationship of the output voltages of said carrier sensing means and said synchronizing signal components sensing means exists.

10. The combination according to claim 9 wherein said manual fine tuning control means disables said first control means and causes said counter means to selectively count in said one and said opposite directions as determined by operation of said manual fine tuning control means.

11. The combination according to claim 10 further including channel selection means for selecting channels to which the television receiver may be tuned, said channel selection means being coupled to said programmable frequency divider means to establish a predetermined initial programmable fraction therein each time a new channel is selected by said tuning selection means.

12. A frequency synthesizer tuning system for a tuner of a television receiver capable of receiving a composite television signal, said system including in combination:
reference oscillator means providing a reference signal at a predetermined frequency;
local oscillator means in the tuner providing a variable output frequency in response to the application of a control signal thereto;
a programmable frequency divider having an input coupled to said reference oscillator means for producing an output signal having a frequency which is a programmable fraction of the frequency of the signal applied to the input thereto from said reference oscillator means;
means coupled to the output of said programmable frequency divider and the output of said local oscillator means for developing a control signal and applying such control signal to said local oscillator means for controlling the frequency of operation thereof;
channel selection means coupled to said programmable frequency divider for establishing a predetermined initial programmable fraction therein each time a new channel is selected by said channel selection means; and
manual fine tuning control means coupled to said programmable frequency divider for controlling said frequency divider to change said programmable fraction thereof according to the operation of said manual fine tuning control means.

* * * * *